(12) United States Patent
Miyashita et al.

(10) Patent No.: US 8,051,548 B2
(45) Date of Patent: Nov. 8, 2011

(54) METHOD OF MANUFACTURING AN ELECTROSTATIC CHUCK

(75) Inventors: Kinya Miyashita, Tokyo (JP); Yoshihiro Watanabe, Tokyo (JP)

(73) Assignee: Creative Technology Corporation, Tokyo (JP)

( * ) Notice: Subject to any disclaimer, the term of this patent is extended or adjusted under 35 U.S.C. 154(b) by 0 days.

(21) Appl. No.: 12/676,834

(22) PCT Filed: Sep. 3, 2008

(86) PCT No.: PCT/JP2008/065836
§ 371 (c)(1),
(2), (4) Date: Mar. 5, 2010

(87) PCT Pub. No.: WO2009/031566
PCT Pub. Date: Mar. 12, 2009

(65) Prior Publication Data
US 2010/0254064 A1    Oct. 7, 2010

(30) Foreign Application Priority Data
Sep. 6, 2007    (JP) .................................. 2007-262714

(51) Int. Cl.
*H01S 4/00*    (2006.01)
(52) U.S. Cl. .............. 29/592.1; 29/825; 29/830; 29/832; 361/234
(58) Field of Classification Search .............. 29/825, 29/830, 832, 592.1; 361/234
See application file for complete search history.

(56) References Cited

U.S. PATENT DOCUMENTS

| 5,350,479 | A | * | 9/1994 | Collins et al. | 156/345.53 |
| 5,644,467 | A | * | 7/1997 | Steger et al. | 361/234 |
| 5,715,132 | A | * | 2/1998 | Steger et al. | 361/234 |

FOREIGN PATENT DOCUMENTS

| JP | 9-129717 A | 5/1997 |
| JP | 2004-031665 | 1/2004 |
| JP | 2004-349664 A | 12/2004 |

* cited by examiner

*Primary Examiner* — Carl Arbes
(74) *Attorney, Agent, or Firm* — Birch, Stewart, Kolasch & Birch, LLP

(57) ABSTRACT

Provided is a method of manufacturing a gas supply structure for use in an electrostatic chuck apparatus having an electrostatic chuck on the upper surface side of a metal base (1), the gas supply structure being capable of eliminating contamination due to nonuniform cooling gas jetting quantities and deposition of a thermally spraying material and the like. The method of manufacturing the gas supply structure for supplying a cooling gas supplied from the lower surface side of the metal base (1) to the back surface of a substrate (W) attracted to an upper insulating layer (6) side, through a gas supply path (3) provided on the metal base (1), the method including: prior to a step of forming a lower insulating layer (4) by thermally spraying a ceramic powder on the upper surface side of the metal base (1), a step of forming an attracting electrode (5), and a step of forming the upper insulating layer (6), a step of blocking a gas supply path outlet (3a) on the upper surface side of the metal base (1) with an adhesive (8), the adhesive containing a filler made of the same material as that of the ceramic powder that is used for forming the lower insulating layer (4); and a step of opening a hole toward the gas supply path outlet (3a) of the metal base (1) after forming the upper insulating layer (6), to thereby form a through hole (9) reaching the gas supply path (3).

5 Claims, 4 Drawing Sheets

METHOD OF MANUFACTURING AN ELECTROSTATIC CHUCK

TECHNICAL FIELD

The present invention relates to a method of manufacturing a gas supply structure applied to an electrostatic chuck apparatus, a gas supply structure applied to an electrostatic chuck apparatus, and an electrostatic chuck apparatus. Specifically, the present invention relates to a gas supply structure applied to an electrostatic chuck apparatus, for cooling, with cooling gas, a substrate attracted by an electrostatic chuck.

BACKGROUND ART

As to a plasma treatment apparatus, an electron lithography apparatus, an ion implantation apparatus, and the like, which are used in a manufacturing process of a semiconductor device, and an ion doping apparatus and the like, which are used for manufacturing a liquid crystal panel, it is required to securely hold a semiconductor wafer, a glass substrate, or the like, which is an object to be treated, without causing damage thereto. In particular, contamination of the semiconductor wafer, the glass substrate, or the like, to be treated should be controlled stringently these days, hence most of the systems which have been conventionally employed for clamping the substrate mechanically are being replaced with the electrostatic chuck systems that utilize an electrostatic attraction force. This is because a material of the clamp itself (aluminum material in many cases) is exposed to plasma during the treatment to be spattered therefrom, or ion irradiation in the ion implantation treatment causes the clamp to be spattered, which lead to generation of suspended matter. If the suspended matter falls onto the retained substrate, the semiconductor device or the liquid crystal display panel is significantly affected, for example, in characteristic, yield, or the like.

FIG. 5 is a schematic cross sectional view of a typical electrostatic chuck apparatus, which illustrates a conventional example of an electrostatic chuck apparatus. The electrostatic chuck apparatus includes a metal base 1 made of aluminum, copper, stainless steel, or the like, an electrostatic chuck 7 formed on an upper surface side (substrate w side) of the metal base 1. The electrostatic chuck 7 includes a lower insulating layer 4, an attracting electrode 5 and an upper insulating layer 6. As an example of use of the electrostatic chuck apparatus, when the substrate w including a semiconductor wafer or the like is subjected to etching treatment in, for example, a plasma apparatus, the temperature of the substrate w temperature increases up to approximately 200 to 400° C. Accordingly, it is necessary to cool down the temperature of the substrate under the treatment to an appropriate temperature. For this reason, a liquid conduit 2 is usually formed inside the metal base 1 so as to allow a liquid cooling medium such as pure water to flow therethrough. The liquid cooling medium supplied externally via a heat exchanger and the like (not shown) is circulated inside the metal base, to thereby cool the substrate w. In addition to indirectly cooling the metal base 1 by cooling the substrate w as described above, other means are adopted in which cooling gas, such as helium, supplied from the lower surface side of the metal base 1 is supplied to the back surface side of the substrate w through a gas supply path 3 provided to the metal base 1, to thereby cool the substrate w directly.

In order to employ the cooling means of the latter, that is, in order to send the cooling gas supplied from the lower surface side of the metal base 1 to the back surface side of the substrate w attracted to the electrostatic chuck 7 so as to cool the same, gas supply path outlets (gas exhaust holes) 3a having a diameter of approximately 1 mm are usually formed in the upper surface side of the metal base 1. After forming the electrostatic chuck 7 on the upper surface side of the metal base 1, through holes are formed from the upper insulating layer 6 side of the electrostatic chuck 7 to the gas supply path outlets 3a, so as to allow the cooling gas to be supplied toward the back surface of the substrate w. Here, it is required to supply the cooling gas uniformly to the substrate w, and hence the gas supply path outlets 3a on the upper surface side of the metal base 1 may be formed as many as approximately 200 in the case of the metal base 1 for attracting a semiconductor wafer having a diameter of 300 mm, for example.

Meanwhile, when forming the electrostatic chuck 7 on the upper surface side of the metal base 1 having a gas supply path outlet 3a formed therein, if the lower insulating layer 4 is formed by thermal spraying of a ceramic powder, for example, a part of the thermal-sprayed ceramic powder may be deposited in the gas supply path 3 via the gas supply path outlets 3a. The deposit 10 in the gas supply path 3 may prevent the cooling gas from being jetted out, making an amount of gas to be jetted nonuniform when the electrostatic chuck apparatus is used. In addition, the deposit 10 maybe jetted out together with the cooling gas toward the substrate w side and may become a source of contamination. Therefore, the inventors of the present invention have proposed a method of bonding an insulating plate to each gas supply path outlet 3a of the metal base 1 before forming the lower insulating layer 4 (see Paragraph 0010 in Patent Document 1). However, the work of bonding the plate to every gas supply path outlet 3a requires enormous efforts than expected, so it is necessary to improve the technique further.

Patent Document 1: JP 2004-349664A

DISCLOSURE OF THE INVENTION

Problem to be Solved by the Invention

Under this circumstance, the inventors of the present invention have further studied the gas supply structure of the electrostatic chuck apparatus, and found the following fact as a result, to thereby complete the present invention. Before forming the lower insulating layer, the gas supply path outlet is blocked with adhesive containing filler made of the same material as the ceramic powder to be used for forming the lower insulating layer. After the upper insulating layer is formed, through holes are formed from the upper insulating layer side toward the gas supply path outlet. As a result, productivity of the gas supply structure is dramatically improved, and occurrence of cracks that may occur in the interface between the metal base and the lower insulating layer in the gas supply path outlet may be avoided.

Therefore, it is an object of the present invention to provide a method of forming with ease the gas supply structure for the electrostatic chuck apparatus, which is capable of preventing nonuniform jet amount of the cooling gas and contamination due to deposition of thermal sprayed material or the like.

In addition, another object of the present invention is to provide the gas supply structure for the electrostatic chuck apparatus, which is capable of preventing nonuniform outflow of the cooling gas and contamination due to deposition of thermal sprayed material or the like, while the metal base and the lower insulating layer have a satisfactory junction interface therebetween in the gas supply path outlet.

Means for Solving the Problems

That is, the present invention provides a method of manufacturing a gas supply structure for use in an electrostatic chuck apparatus, the electrostatic chuck apparatus including a metal base and an electrostatic chuck having a lower insulating layer, an attracting electrode, and an upper insulating layer, formed on an upper surface side of the metal base, the gas supply structure being for supplying cooling gas supplied from a lower surface side of the metal base to a back surface of a substrate attracted to the upper insulating layer side through a gas supply path provided to the metal base, the method including: a step of forming the lower insulating layer by thermal spraying of a ceramic powder onto the upper surface side of the metal base; a step of forming the attracting electrode; a step of forming the upper insulating layer; prior to the above steps, a step of blocking a gas supply path outlet on the upper surface side of the metal base with an adhesive containing a filler made of the same material as that of the ceramic powder that is used for forming the lower insulating layer; and a step of forming a through hole from the upper insulating layer side toward the gas supply path outlet of the metal base, the through hole communicating with the gas supply path, after forming the upper insulating layer.

Further, the present invention also provides a gas supply structure for use in an electrostatic chuck apparatus, the gas supply structure being for supplying cooling gas supplied from a lower surface side of the metal base to a back surface of a substrate attracted to the upper insulating layer side through a gas supply path provided to the metal base, the gas supply structure being obtained by the method including: a step of forming the lower insulating layer by thermal spraying of a ceramic powder onto the upper surface side of the metal base; a step of forming the attracting electrode; a step of forming the upper insulating layer; prior to the above steps, a step of blocking a gas supply path outlet on the upper surface side of the metal base with an adhesive containing a filler made of the same material as that of the ceramic powder that is used for forming the lower insulating layer; and a step of forming a through hole from the upper insulating layer side toward the gas supply path outlet of the metal base, the through hole communicating with the gas supply path, after forming the upper insulating layer.

Still further, the present invention provides an electrostatic chuck apparatus having the above-described gas supply structure.

Hereinafter, the present invention is described while illustrating a procedure which relates to a method of manufacturing the gas supply structure in the electrostatic chuck apparatus. Note that the term "upper surface" refers to a surface on the substrate side to be attracted and held, and the term "lower surface" refers to a surface opposite to the substrate to be attracted and held, unless otherwise specified in the present invention.

First, the gas supply path outlet $3a$ formed on the upper surface side of the metal base 1 as illustrated in FIG. $4(a)$ is blocked with an adhesive 8 as illustrated in FIG. $4(b)$. The adhesive used here contains filler made of the same material as a ceramic powder that is used for forming the lower insulating layer by thermal spraying. In other words, if thermal spraying of an alumina ($Al_2O_3$) powder is performed, for example, on the upper surface side of the metal base so as to form the lower insulating layer, the adhesive should contain alumina. The reason why the adhesive should contain filler made of the same material as the ceramic powder to be used for forming the lower insulating layer is to make the adhesive similar in characteristic such as a thermal expansion coefficient to the lower insulating layer, to thereby minimize the stress occurring in the interface with the lower insulating layer due to a thermal load.

In addition, according to the present invention, it is preferable to use the adhesive made of a filler and an alkoxide. Depending on the application, the electrostatic chuck apparatus may be exposed to a high-temperature environment exceeding 300° C. If the gas supply path outlet is blocked with epoxy adhesive, the adhesive may be sublimed or carbonized in such a high-temperature environment. In this case, the decomposed adhesive may be jetted out in part together with the cooling gas, leading to contamination. If the above-described adhesive made of a filler and an alkoxide is used, the above-mentioned problem may not be caused even in the high-temperature environment above 300° C. It is more preferable that the alkoxide should not contain a sodium component. If the alkoxide contains a sodium component, molecules thereof may be liberated in the high temperature, leading to contamination. In particular, sodium may disturb the potential at the junction part of the semiconductor device, with the result that a transistor satisfying design values may not be formed in some cases. A specific example of the adhesive to be used in the present invention may include a family of products of Ceramabond (trademark of Aremco Products, Inc. USA). Ceramabond 569 (trademark of Aremco Products, Inc. USA) may be an example of the alkoxide that does not contain a sodium component. The alkoxide that does not contain a sodium component include a case where the metal forming the alkoxide is other than sodium, which should not interpreted to exclude a case where sodium is inevitably mixed to the extent that does not cause the above-described problem.

After blocking the gas supply path outlet $3a$ with the adhesive 8 and confirming that the adhesive 8 is cured, the lower insulating layer 4, the attracting electrode 5, and the upper insulating layer 6 are formed in this order from the upper surface side of the metal base 1 as illustrated in FIG. $4(c)$. Here, the lower insulating layer 4, the attracting electrode 5, and the upper insulating layer 6 may be formed in shapes, thicknesses, materials, manufacturing conditions, and the like similar to those in a case of a known electrostatic chuck apparatus. For instance, the upper and lower insulating layers 4 and 6 may be formed of an insulating film made of polyimide or the like, a ceramic plate, or a thermal-sprayed ceramic powder to have a predetermined shape and thickness. The attracting electrode 5 may be formed of a metal foil or film that is formed by a spattering method, an ion plating method, or the like, and is etched to be in a predetermined shape. Alternatively, the attracting electrode having a predetermined shape may be obtained by thermal spraying of conductive metal or printing of conductive metal paste. However, the present invention achieves maximum effect when at least the lower insulating layer 4 is formed by thermal spraying of a ceramic powder on the upper surface side of the metal base 1. If the lower insulating layer 4 is made of an insulating film, or if the electrostatic chuck including the lower insulating layer, the attracting electrode, and the upper insulating layer is separately manufactured and is adhered to the upper surface side of the metal base 1, the problem of deposition of the thermal sprayed material in the gas supply path 3 of the metal base 1 hardly occurs. Therefore, the effect of the present invention may not be confirmed sufficiently.

The ceramic powder for forming the lower insulating layer 4 may include a known powder such as an alumina ($Al_2O_3$) powder, an aluminum nitride (AlN) powder, a zirconia ($ZrO_2$) powder, a silica ($SiO_2$) powder, and the like, which may be used alone, or in combination of two or more.

Further, after forming the upper insulating layer 6, a hole is formed from the upper insulating layer side toward the gas supply path outlet $3a$ of the metal base 1 as illustrated in FIG.

4(d), so that the hole penetrates the adhesive 8 blocking the gas supply path outlet 3a, to thereby form the through hole 9 communicating with the gas supply path 3. Means for forming the through hole 9 may not be particularly limited, and general machining processes, preferably a diamond drill or the like may be used. A diamond drill is superior in cutting force and durability, and hence is particularly effective in the case where not only the lower insulating layer but also the upper insulating layer is formed by thermal spraying, or in the case of forming a lot of through holes. Further, it is preferable to use a diamond drill while jetting compressed air toward the gas supply path outlet 3a so as to form the through hole. By jetting compressed air while a hole is being formed, it is possible to prevent accumulated scrapes and chips from directly dropping in the gas supply path 3. Pressure of the compressed air is preferably 2 to 5 kg/cm² considering workability and the like.

Size of the through hole 9 may be designed in accordance with a shape of the gas supply path outlet 3a formed in the metal base 1. An opening size (diameter) of the general gas supply path outlet 3a is approximately 1 to 5 mm. For example, if the opening size of the gas supply path outlet 3a is 1.4 mm, it is preferable that the diameter of the through hole 9 should approximately be 0.2 to 1 mm. If the opening size of the gas supply path outlet 3a is larger than the diameter of the through hole 9, the adhesive 8 blocking the gas supply path outlet 3a remains in part on the inner surface of the gas supply path outlet 3a. Then, as a part encircled by the broken line in FIG. 4(d), a junction interface between the adhesive 8 and the lower insulating layer 4 is formed in part of the gas supply path outlet 3a. Because the adhesive 8 containing the filler made of the same material as the ceramic powder forming the lower insulating layer 4 is used in the present invention, a satisfactory junction interface may be obtained, and hence the secure adhesiveness may be sustained against thermal stress or the like, to thereby eliminate a possibility of occurrence of a crack, a gap, or the like, with more reliability. In addition, as illustrated in FIG. 2, the gas supply path outlet 3a may be formed so as to increase in diameter gradually toward the upper surface side of the metal base 1. Alternatively, the gas supply path outlet may be formed to have a countersunk portion 3b as illustrated in FIG. 3. With these structures, the adhesive 8 remains in larger amount between the through hole 9 and the inner surface of the gas supply path outlet 3a, making the junction interface with the lower insulating layer 4 further reliable.

According to the present invention, the upper surface of the metal base 1 may be ground after the gas supply path outlet 3a on the upper surface side of the metal base 1 is blocked with the adhesive 8 and the adhesive 8 is cured, or the surface of the upper insulating layer 6 for attracting the substrate w may be ground after forming the through hole 9, to thereby perform as an appropriate smoothing process. In addition, a gas trench having a predetermined shape may be formed in the upper insulating layer 6 after forming the through hole 9 so that the cooling gas is supplied uniformly toward the back surface of the substrate w. As a matter of course, it is possible to adopt a structure, a manufacturing process, or the like of a conventional electrostatic chuck apparatus as long as the effect of the present invention may not be affected. Further, the gas supply structure obtained by the present invention may use the same cooling gas as the cooling gas used in a general electrostatic chuck apparatus, and it is unnecessary to change gas flow rate, gas pressure, or the like in particular in gas cooling.

Effects of the Invention

According to the method of manufacturing the gas supply structure of the present invention, it is possible to eliminate a possibility of occurrence of deposition and adhesion of a part of thermal sprayed material in the gas supply path of the metal base when the lower insulating layer is formed by thermal spraying. Therefore, it is possible to eliminate the conventional problem that a part of deposits suspends together with the cooling gas in the gas supply path so as to cause unevenness of gas flow rate to be supplied to the substrate side, or to be jetted to the substrate side so as to cause contamination. The method according to the present invention may be adopted not only in manufacturing a new electrostatic chuck apparatus but also in reusing a used electrostatic chuck apparatus that has already reached the product life so as to reproduce the gas supply structure.

In addition, the gas supply structure obtained by the present invention is capable of preventing nonuniform jet amount of the cooling gas and contamination due to deposition of thermal sprayed material or the like. In addition, the metal base and the lower insulating layer has a satisfactory junction interface in the gas supply path outlet, and hence the gas supply structure excels in durability over a long period of time.

DESCRIPTION OF SYMBOLS

1: metal base, 1a: placement table, 2: liquid duct, 3: gas supplypath, 3a: gas supplypath outlet, 3b: countersunk portion, 4: lower insulating layer, 5: attracting electrode, 6: upper insulating layer, 7: electrostatic chuck, 8: adhesive, 9: through hole, 10: deposit

BEST MODES FOR CARRYING OUT THE INVENTION

Hereinafter, preferred embodiments of the present invention is described in detail with reference to the attached drawings.

EXAMPLE 1

Figure 1:
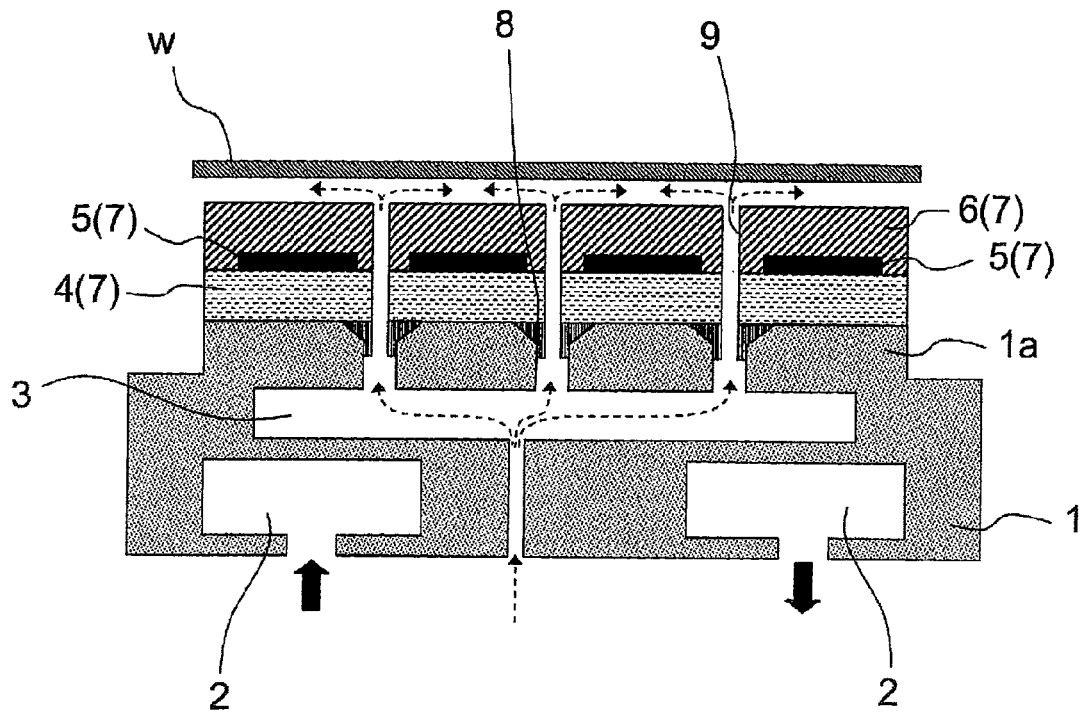
FIG. 1 is a cross sectional explanatory diagram of an electrostatic chuck apparatus having a gas supply structure according to the present invention.
Figure 2:
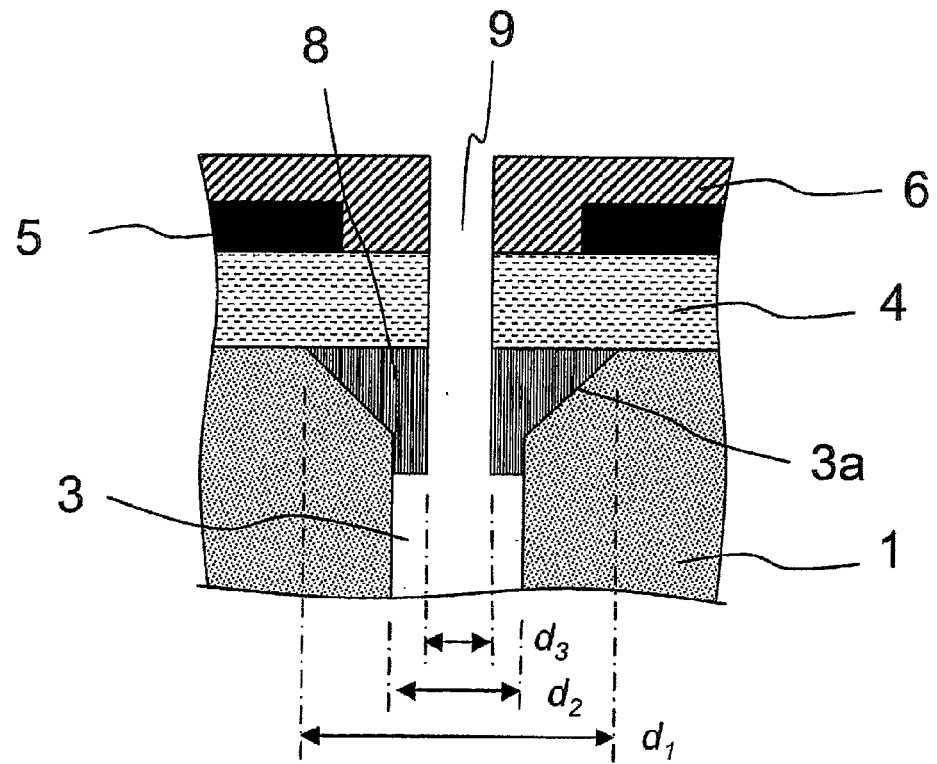
FIG. 2 is a cross sectional explanatory diagram of the gas supply structure enlarged in part.
Figure 3:
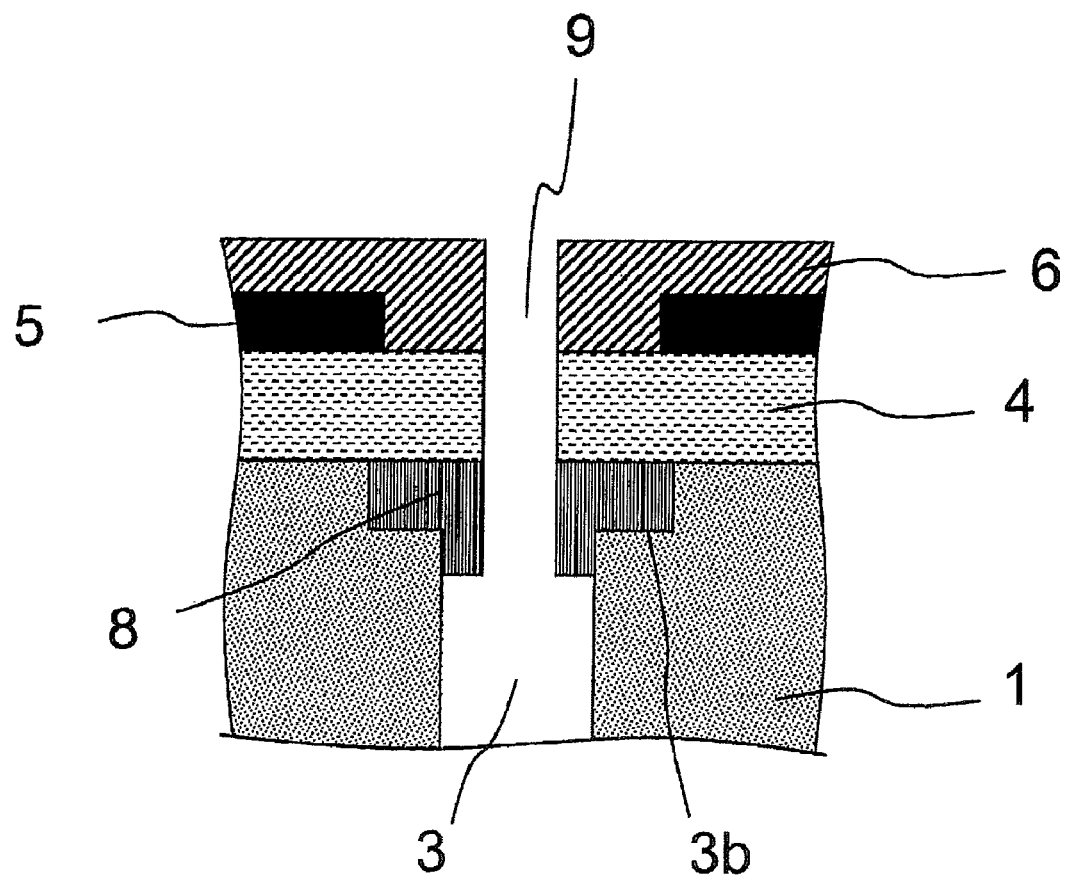
FIG. 3 illustrates a variation example of the gas supply structure according to the present invention and is a cross sectional explanatory diagram thereof enlarged in part.
Figure 4:
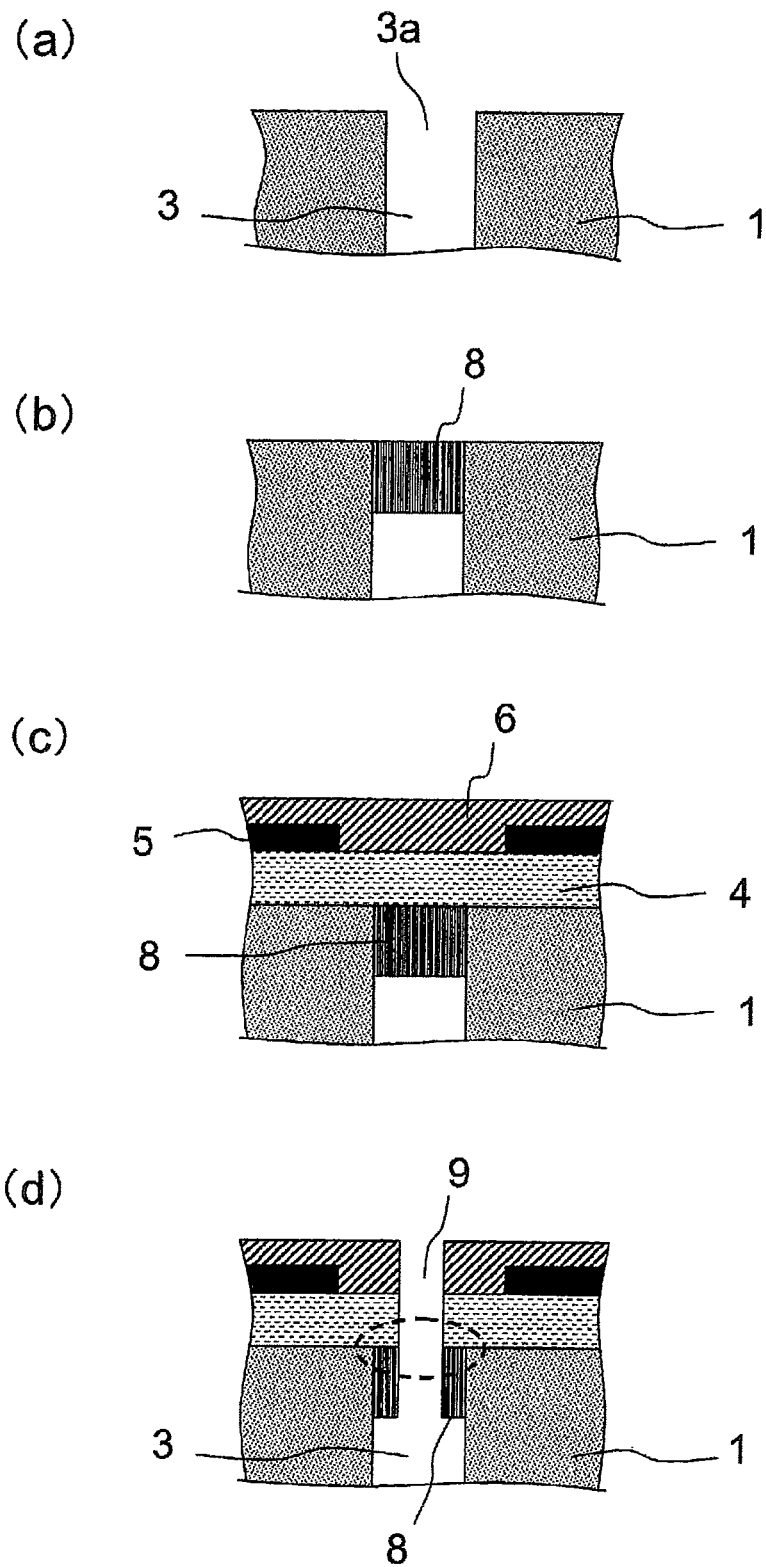
FIG. 4 are cross sectional explanatory diagrams illustrating a manufacturing procedure of a gas supply structure.
Figure 5:
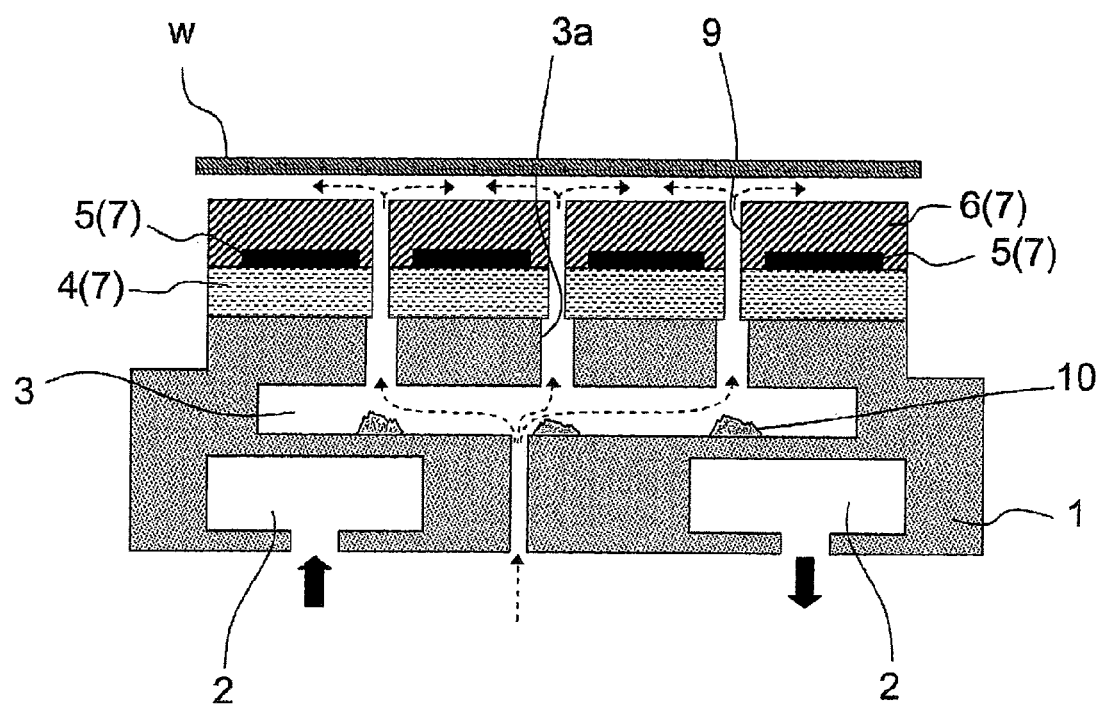
FIG. 5 is a cross sectional explanatory diagram illustrating a conventional example of an electrostatic chuck apparatus.

FIG. 1 is a cross sectional explanatory diagram of an electrostatic chuck apparatus having a gas supply structure according to the present invention, and FIG. 2 is a cross sectional explanatory diagram of the gas supply structure enlarged in part. Here, an example of a metal base 1 made of aluminum is mainly described, which is suitable for attracting a silicon wafer having a diameter of 300 mm. An upper surface side of the metal base 1 has a placement table 1a having a diameter of 196 mm. In addition, liquid conduit 2 are formed inside the metal base 1 so as to allow water supplied from the lower surface side to circulate and flow out from the lower surface side again. Further, a gas supply path 3 is formed for supplying a cooling gas supplied from the lower surface side of the metal base 1 (as illustrated by broken lines with arrows in FIG. 2) to the substrate w attracted to the electrostatic chuck 7 that is formed later. The gas supply path 3 is described in more detail as follows. The gas supply path 3 is formed to extend in part from inside of the metal base 1 toward the placement table 1a side of the metal base 1 with a diameter ($d_2$) of 2.5 mm, and is chamfered in the vicinity of a surface of the placement table 1a (which is called usually a c-surface, and is chamfered in a range of C0.2 to 2 mm). Specifically, the gas supply path outlet 3a has a diameter increasing gradually from a depth of about 5 mm of the placement table 1a toward the surface of the placement table 1a, and an opening on the surface of the placement table 1a has a diameter ($d_1$) of 3.5 mm. The number of the gas supply path outlets 3a as described above formed in the surface of the placement table 1a is 150 in total, which are distributed at uniform intervals.

After removing burrs of the metal base 1 and cleaning the same with organic solvent, the adhesive 8 was injected in appropriate quantity into the gas supply path outlet 3a from the surface of the placement table 1a using a dispenser. The adhesive 8 used here is Ceramabond 569 (trademark of Aremco Products, Inc. USA), which contains filler made of alumina and does not contain a sodium component. The adhesive 8 was filled to approximately 2 mm in the depth direction of the placement table 1a. In addition, the adhesive was also filled in the chamfered part of the gas supply path outlet 3a, and excessive adhesive was removed so that all the gas supply path outlets 3a were blocked with the adhesive 8. Then, the adhesive 8 was dried to be cured for 12 hours at room temperature, and then a melted alumina powder of purity at 99.99% was thermal-sprayed onto the placement table 1a of the metal base 1, to thereby form the lower insulating layer 4 having a thickness of 200 μm. Next, a predetermined mask was placed on the surface of the obtained lower insulating layer 4, and a tungsten powder of purity at 99.99% was thermal-sprayed, to thereby form the attracting electrode 5 having a thickness of 50 μm. In addition, an alumina powder of purity at 99.99% was thermal-sprayed onto the attracting electrode 5, to thereby form the upper insulating layer 6 having a thickness of 300 μm.

As described above, the electrostatic chuck 7 having the lower insulating layer 4, the attracting electrode 5, and the upper insulating layer 6, was formed on the upper surface side of the metal base 1, and then holes were formed from the upper insulating layer side toward the positions corresponding to the gas supply path outlets 3a in the metal base 1 in the vertical direction so as to penetrate the cured adhesive 8, to thereby form through holes communicating with the gas supply path 3. In this case, a diamond drill was used while supplying compressed air at approximately 3 kg/cm², so that the through hole having a diameter ($d_3$) of 1 mm was formed corresponding to each of all the gas supply path outlets 3a in the metal base 1. Finally, burrs and oil components were removed by ultrasonic cleaning using organic solvent, to thereby complete the electrostatic chuck apparatus having the gas supply structure according to the present invention.

EXAMPLE 2

Next, an example of a case of reproducing a gas supply structure of a used electrostatic chuck apparatus is described.

First, the upper insulating layer 6, the attracting electrode 5, and the lower insulating layer 4 were removed from a used electrostatic chuck apparatus by machine grinding with manual work in part. In this case, the process was performed so that the lower insulating layer 4 remained in part on the surface, and further a sandblast process was performed so that the metal base 1 was removed by the thickness in a range from 0.05 to 0.5 mm. Thus, the metal base surface was exposed so that flatness of the placement table 1a of the metal base 1 was reduced to 30 μm or smaller. Next, the gas supply path outlet 3a of the metal base 1 was chamfered in a range from C0.2 to 2 mm so as to prepare the metal base 1 for reproduction.

After removing burrs of the above-described metal base 1 and cleaning the same with organic solvent, all the gas supply path outlets 3a were blocked with the adhesive 8 similarly to Example 1. Then, after the adhesive 8 is cured, a melted alumina powder of purity at 99.99% was thermal-sprayed onto the placement table 1a of the metal base 1, to thereby form the lower insulating layer 4. Here, the thickness of the lower insulating layer 4 was set to 200 μm+α (α corresponds to the removed thickness of the metal base 1). Next, similarly to Example 1, the attracting electrode 5 and the upper insulating layer 6 were formed.

As described above, the electrostatic chuck 7 having the lower insulating layer 4, the attracting electrode 5, and the upper insulating layer 6, was formed on the upper surface side of the metal base 1, and then the through holes were formed, similarly to Example 1, so as to correspond to all the gas supply path outlets 3a in the metal base 1. Finally, burrs and oil components were removed by ultrasonic cleaning using organic solvent, to thereby reproduce the electrostatic chuck apparatus having the gas supply structure according to the present invention.

INDUSTRIAL APPLICABILITY

The gas supply structure according to the present invention may be applied to a plasma process apparatus, an electron exposure apparatus, an ion implantation apparatus, and the like which are used in a manufacturing process of a semiconductor device, an ion doping apparatus and the like which are used in a manufacturing process of a liquid crystal display panel, and other various electrostatic chuck apparatus. In addition, the gas supply structure according to the present invention may be applied not only to a case of producing a new electrostatic chuck apparatus but also to a case of reusing an electrostatic chuck apparatus that has already reached the product life.

The invention claimed is:

1. A method of manufacturing an electrostatic chuck apparatus which comprises a metal base and an electrostatic chuck;
   wherein the metal base has a gas supply path formed in the inside of the metal base and a plurality of gas supply path outlets from the gas supply path to the upper surface of the metal base, and the electrostatic chuck has a lower insulating layer, an attracting electrode, and an upper insulating layer which are formed in order from the bottom on an upper surface side of the metal base, and
   wherein the electrostatic chuck has a plurality of through holes in which each upper end is opening to the surface thereof and each lower end is communicating with the gas supply path through each of the gas supply path outlets for supplying cooling gas supplied from a lower surface side of the metal base to a back surface of a substrate attracted to the upper insulating layer side through the gas supply path provided to the metal base;
   the method comprising:
   a first step of blocking the gas supply path outlets on the upper surface side of the metal base with an adhesive containing a filler made of the same material as that of the ceramic powder that is used for forming the lower insulating layer;

a second step of forming the lower insulating layer by thermal spraying of a ceramic powder onto the upper surface side of the metal base, after blocking the gas supply path outlets of the metal base;

a third step of forming the attracting electrode, after forming the lower insulating layer;

a fourth step of forming the upper insulating layer, after forming the attracting electrode; and a fifth step of forming the through holes from the upper insulating layer side toward the gas supply path outlets of the metal base in which each lower end is communicating with the gas supply path, after forming the upper insulating layer.

2. A method of manufacturing the electrostatic chuck apparatus according to claim 1, wherein an aperture diameter of the gas supply path outlet on the upper surface side of the metal base is larger than a diameter of the through hole, and the adhesive blocking the gas supply path outlet remains in part on an inner surface of the gas supply path outlet so as to have a junction interface between the adhesive and the lower insulating layer in part of the gas supply path outlet.

3. A method of manufacturing the electrostatic chuck apparatus according to claim 2, wherein the diameter of the gas supply path outlet increases gradually toward the upper surface side of the metal base.

4. A method of manufacturing the electrostatic chuck apparatus according to claim 2, wherein the gas supply path outlet has a countersunk portion.

5. A method of manufacturing the electrostatic chuck apparatus according to claim 1, wherein the step of forming the through holes comprising forming the through holes by using a diamond drill while jetting compressed air toward the gas supply path outlets.

* * * * *